United States Patent
Yanagidaira et al.

(10) Patent No.: US 9,570,182 B1
(45) Date of Patent: Feb. 14, 2017

(54) SEMICONDUCTOR MEMORY DEVICE AND MEMORY SYSTEM

(71) Applicant: KABUSHIKI KAISHA TOSHIBA, Minato-ku (JP)

(72) Inventors: Kosuke Yanagidaira, Fujisawa (JP); Shouichi Ozaki, Komae (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/000,687

(22) Filed: Jan. 19, 2016

Related U.S. Application Data

(60) Provisional application No. 62/213,384, filed on Sep. 2, 2015.

(51) Int. Cl.
G11C 16/04 (2006.01)
G11C 16/14 (2006.01)
G11C 16/26 (2006.01)

(52) U.S. Cl.
CPC ........... *G11C 16/14* (2013.01); *G11C 16/26* (2013.01)

(58) Field of Classification Search
CPC .................................................. G11C 16/04
USPC ....................................... 365/185.01–185.33
See application file for complete search history.

(56) References Cited

U.S. PATENT DOCUMENTS

| 7,061,828 | B2* | 6/2006 | Takatsuka | G11C 8/18 365/222 |
| 7,692,982 | B2 | 4/2010 | Yoon | |
| 8,437,216 | B2 | 5/2013 | Oh et al. | |
| 2006/0050587 | A1* | 3/2006 | Takatsuka | G11C 8/18 365/222 |
| 2013/0070536 | A1* | 3/2013 | Takai | G11C 7/04 365/189.05 |
| 2014/0185384 | A1 | 7/2014 | Kim et al. | |

* cited by examiner

*Primary Examiner* — Harry W Byrne
(74) *Attorney, Agent, or Firm* — Oblon, McClelland, Maier & Neustadt, L.L.P.

(57) ABSTRACT

According to one embodiment, a semiconductor memory device comprises an input circuit configured to input data, a memory cell array which includes memory cells enabling data to be held and to which the input data is written, a control circuit configured to control operation of a memory relating to the data, and a training circuit configured to execute training of the input circuit in parallel with the operation of the memory.

18 Claims, 9 Drawing Sheets

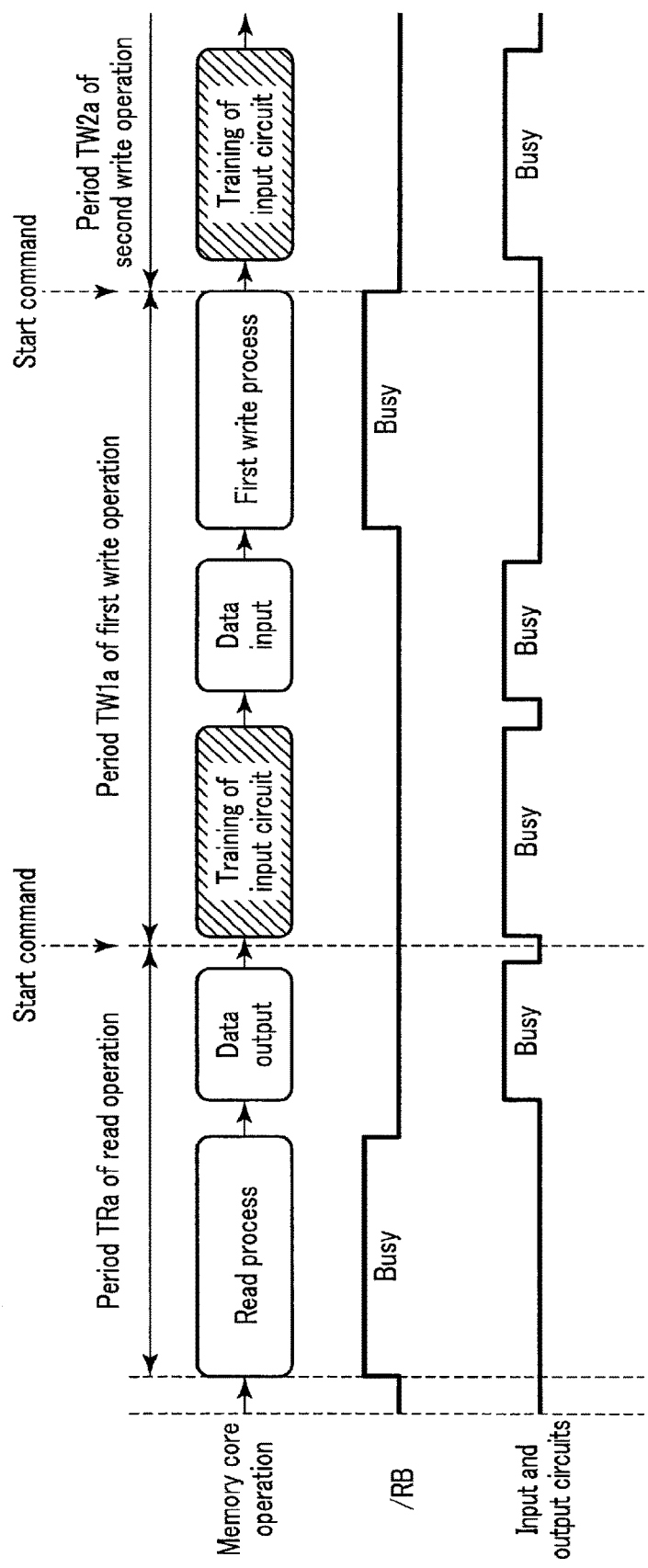
F I G. 5

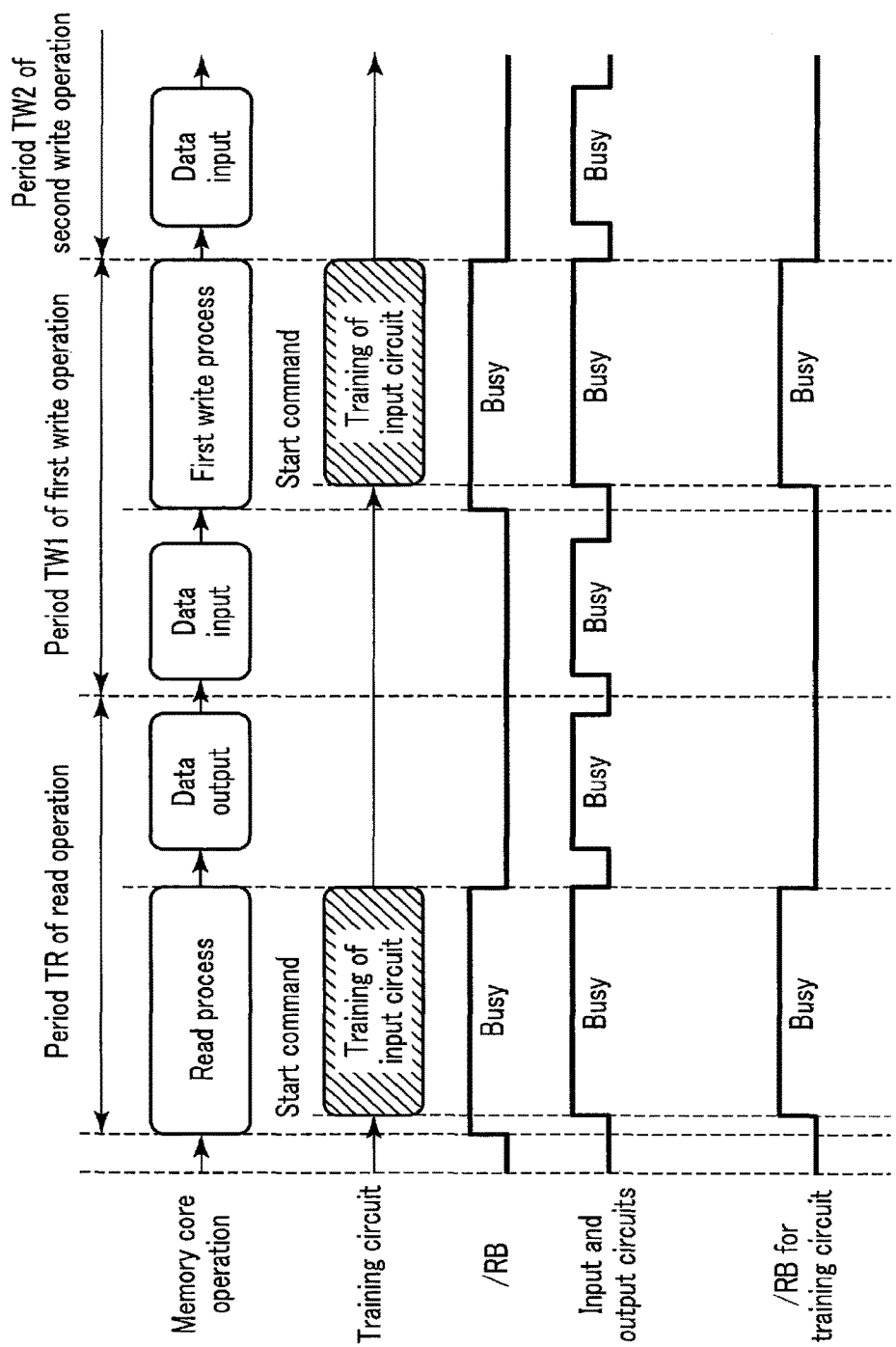
F I G. 8

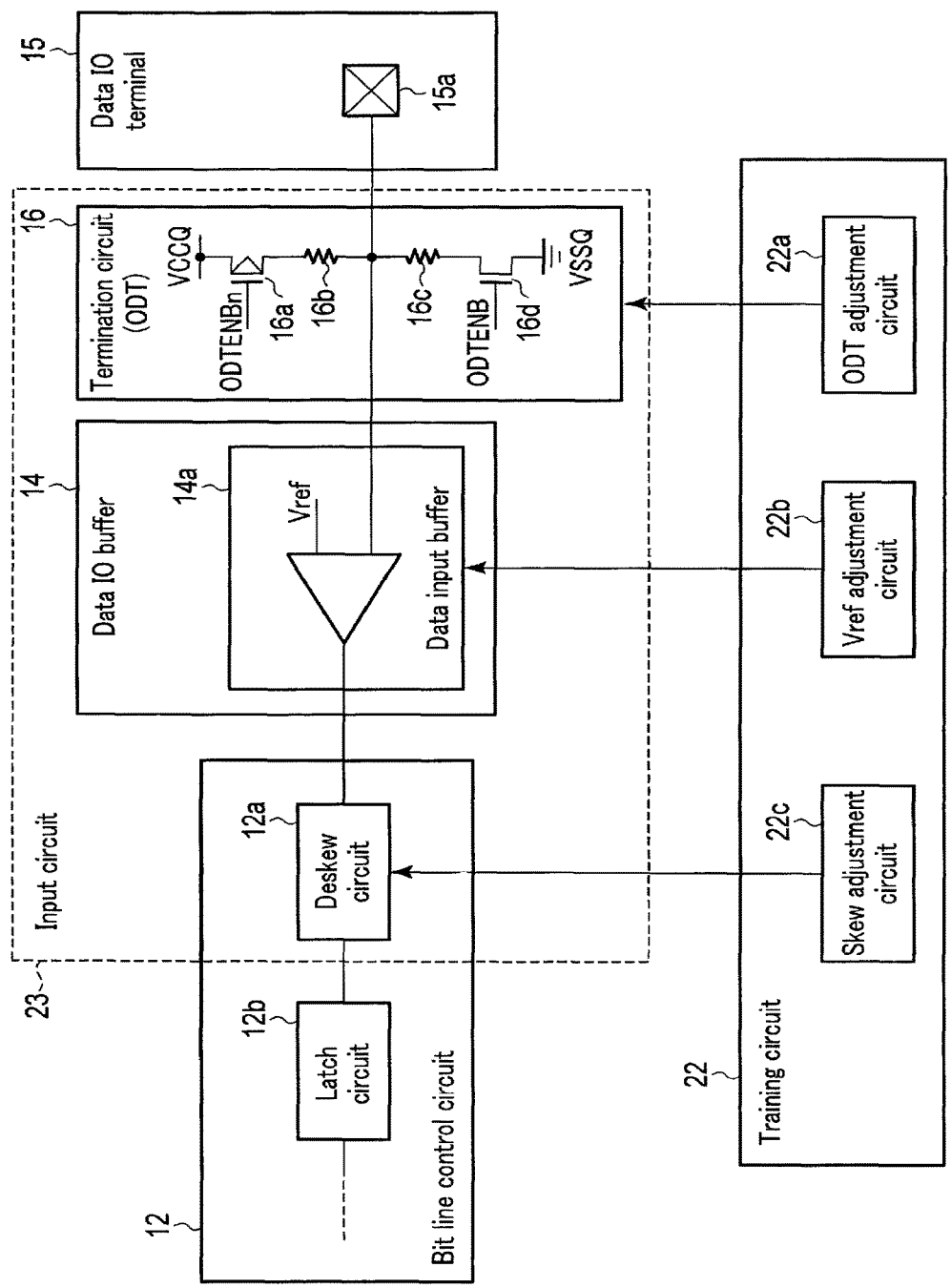
F I G. 11

SEMICONDUCTOR MEMORY DEVICE AND MEMORY SYSTEM

CROSS-REFERENCE TO RELATED APPLICATIONS

This application is based upon and claims the benefit of U.S. Provisional Application No. 62/213,384, filed on Sep. 2, 2015, the entire contents of which are incorporated herein by reference.

FIELD

Embodiments relate to a semiconductor memory device and a memory system.

BACKGROUND

A semiconductor memory device with a training function for an input circuit is known.

BRIEF DESCRIPTION OF THE DRAWINGS

FIG. 5 is a time chart of a comparative example for illustrating effects according to the first embodiment;

FIG. 8 is a time chart for illustrating a second variation of the training method of the input circuit according to the first embodiment;

FIG. 11 is a schematic diagram depicting a partial configuration of a semiconductor memory device according to a second embodiment.

DETAILED DESCRIPTION

Figure 1:
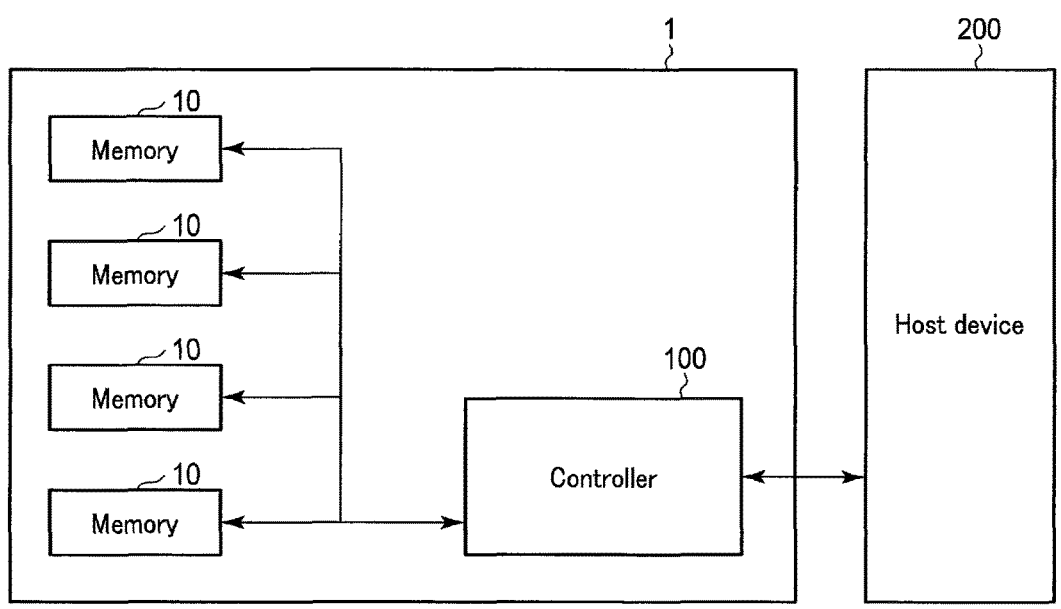
FIG. 1 is a schematic diagram depicting a memory system and a peripheral configuration therefor according to a first embodiment.

In general, according to one embodiment, there is provided a semiconductor memory device comprising: an input circuit configured to input data, a memory cell array which includes memory cells enabling data to be held and to which the input data is written, a control circuit configured to control operation of a memory relating to the data, and a training circuit configured to execute training of the input circuit in parallel with the operation of the memory.

Embodiments will be described below with reference to the drawings. In the description, components having substantially the same functions and configurations are denoted by the same reference numerals. Duplicate descriptions are given only when needed. The drawings are schematic. The embodiments illustrate apparatuses and methods for embodying the technical concepts thereof. The technical concepts of the embodiments are not intended to limit materials, shapes, structures, arrangements, and the like of components to the following.

In the following embodiments, as a semiconductor memory device, a NAND flash memory will be described by way of example.

First Embodiment

[1-1] Configuration

[1-1-1] Configuration of the Memory System

A configuration of a memory system comprising a semiconductor memory device according to a first embodiment will be described using FIG. 1. FIG. 1 is a schematic diagram depicting a memory system and a peripheral configuration therefor according to the first embodiment.

As depicted in FIG. 1, a memory system 1 comprises a memory 10 and a controller 100. The controller 100 can communicate with host device 200.

The memory 10 is a nonvolatile semiconductor memory, for example, a NAND flash memory. The memory 10 may comprise a plurality of memory chips (not depicted in the drawings) corresponding to memory chips having the same circuit configuration. In this regard, any memory chip may be used as the memory 10, and more specifically, any type of NAND flash memory chip may be used as the memory 10. In FIG. 1, four memories 10 are arranged. However, the number of memories 10 is not limited to four but may be changed as needed. Furthermore, in the present embodiment, the NAND flash memory is used as a nonvolatile semiconductor memory. However, the present embodiment is not necessarily limited to this.

The controller 100 is, for example, a semiconductor chip that performs control of the memory 10, transmission and reception of data, and the like based on commands from the host device 200. The controller 100 is connected to the memory 10 via a data input terminal (a plurality of IO pins) formed in the memory 10 as described below.

[1-1-2] Configuration of the NAND Flash Memory

Figure 2:
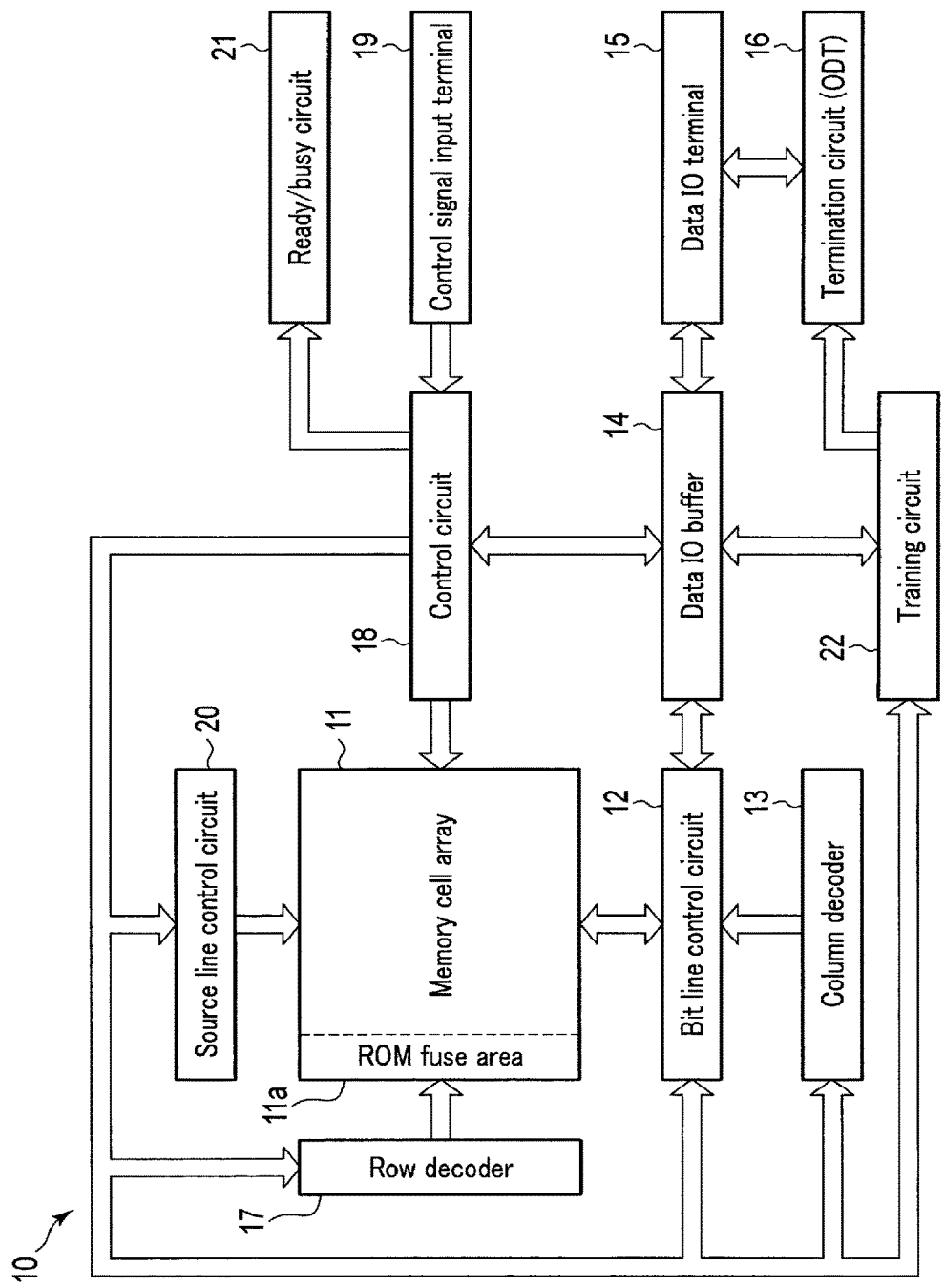
FIG. 2 is a schematic diagram depicting a general configuration of a NAND flash memory according to the first embodiment.

A configuration of the NAND flash memory 10 serving as the semiconductor memory device according to the first embodiment will be described in brief using FIG. 2. FIG. 2 is a schematic diagram depicting a general configuration of the NAND flash memory 10 according to the first embodiment.

As depicted in FIG. 2, the NAND flash memory 10 comprises a memory cell array 11, a bit line control circuit 12, a column decoder 13, a data IO buffer 14, a data IO terminal 15, a termination circuit (ODT) 16, a row decoder 17, a control circuit 18, a control signal input terminal 19, a source line control circuit 20, a ready/busy circuit 21, and a training circuit 22.

The memory cell array 11 includes memory cells that can hold data, and input data is written to the memory cell array 11. Specifically, the memory cell array 11 includes a plurality of bit lines BL, a plurality of word lines WL, a source line SRC. The memory cell array 11 comprises a plurality of blocks BLK in each of which electrically rewritable memory cell transistors (hereinafter sometimes referred to as memory cells or the like) MC are arranged in a matrix. The memory cell MC has, for example, a stack gate including a control gate electrode and a charge storage layer (for example, a floating gate electrode). The memory cell MC stores binary data or multi-valued data in accordance with changes in a threshold for a transistor which are set by the amount of charge injected into the floating gate electrode. Furthermore, the memory cell MC may have a MONOS (Metal-Oxide-Nitride-Oxide-Silicon) structure in which electrons are trapped in a nitride film.

A ROM fuse area 11a that is a predetermined area on the memory cell array 11 stores various initialization values needed for initialization of the memory 10 and the like. The various initialization values are automatically read from the ROM fuse area 11a by the control circuit 18 when the memory 10 is powered on. The various initialization values are indicative of values for a write voltage and an erase voltage and are used for initialization and the like by the control circuit 18.

The bit line control circuit 12 has a sense amplifier (not depicted in the drawings) that senses and amplifies the voltage of any of the bit lines BL in the memory cell array 11 and a data storage circuit (not depicted in the drawings) for latching data to be written. The bit line control circuit 12 reads data from any of the memory cells MC in the memory cell array 11 via the bit line BL, detects the state of the memory cell MC via the bit line BL, and applies a write control voltage to the memory cell MC via the bit line BL to execute writing on the memory cell MC.

The column decoder 13 selects from data storage circuits in the bit line control circuit 12 and outputs data read from the memory cell MC onto the selected data storage circuit, to the exterior (the controller 100) through the data IO terminal 15 via the data IO buffer 14.

The data IO buffer 14 receives data from the data IO terminal 15, and the data is stored in the data storage circuit selected by the column decoder 13. The data IO buffer 14 outputs data to the exterior via the data IO terminal 15.

In addition to the write data, the data IO terminal 15 receives various commands such as for write, read, erase, and status read, and addresses.

The termination circuit 16 is a circuit that terminates reflection of a signal with data or the like which occurs between the data IO terminal 15 and the exterior (controller 100).

The row decoder 17 selects any one of the blocks BLK, with the remaining blocks BLK unselected. In other words, the row decoder 17 applies needed voltages to the word lines WL and select gate lines VSGS, VSGD at the time of a read operation, a write operation, or an erase operation.

The source line control circuit 20 controls the voltage of the source line SRC.

The ready/busy circuit 21 outputs a ready/busy signal to the controller 100 while the operation of the memory is being controlled. The ready/busy signal is a signal indicating a ready state or a busy state of the control circuit 18. The operation of the memory is an operation involving output of a signal indicating the busy state. In this regard, the operation of the memory includes, for example, memory core operations and output circuit setting operations. The memory core operations include a read operation, a write operation, and an erase operation performed on the memory cell array 11. Specifically, the memory core operations mean operations of the memory cell array 11, the bit line control circuit 12, the column decoder 13, the data IO buffer 14, the row decoder 17, and the source line control circuit 20. The memory cell array 11, the bit line control circuit 12, the column decoder 13, the data IO buffer 14, the row decoder 17, and the source line control circuit 20 form a circuit group that performs the operation of the memory relating to data. The output circuit setting operations include an operation referred to as set feature and an operation referred to as ZQ calibration, both of which involve setting an impedance for an output circuit. When the operation of the memory is the output data setting operation, the circuit group that performs the operation of the memory relating to data includes an output circuit that outputs data read from the memory cell array 11 to the exterior. In this regard, the output circuit is, for example, a data output buffer (not depicted in the drawings) in the data IO buffer 14 and the termination circuit 16.

The control circuit 18 controls the operation of the memory. Specifically, the control circuit 18 controls the memory cell array 11, the bit line control circuit 12, the column decoder 13, the data IO buffer 14, the row decoder 17, and the source line control circuit 20. The control circuit 18 includes a booster circuit (not depicted in the drawings) that boosts a power supply voltage. The control circuit 18 allows the booster circuit to boost the power supply voltage as needed to supply the resultant voltage to the bit line control circuit 12, the column decoder 13, the data IO buffer 14, the row decoder 17, and the source line control circuit 20.

The control circuit 18 performs control operations in accordance with control signals received from the exterior via the control signal input terminal 19 and commands received through the data IO terminal 15 via the data IO buffer 14. In this regard, as the control signals, for example, a chip enable signal /CE, a command latch enable signal CLE, and an address latch enable signal ALE are available as needed. That is, at the time of verify, read, or erase, the control circuit 18 generates and supplies a desired voltage to components of the memory cell array 11.

The training circuit 22 executes training of the input circuit during control of the operation of the memory. Specifically, the training circuit 22 executes the training of the input circuit in parallel with the control operation by the control circuit 18. In this regard, as the input circuit, for example, the bit line control circuit 12, the data IO buffer 14, and the termination circuit 16 are available as needed. The training of the input circuit includes, for example, adjustment of skew for a deskew circuit, adjustment of a reference voltage Vref for a data input buffer, and adjustment of a resistance value for the termination circuit 16.

The training of the input circuit can be executed not only during the operation of the memory core but also during the setting operation of, for example, setting the impedance of the output circuit. The impedance setting operation for the output circuit includes, for example, the set feature operation or the ZQ calibration operation in the NAND flash memory. In addition to this, the training of the input circuit can be executed not only during the memory core operation and the impedance setting operation for the output circuit but also in parallel with any operation other than the training of the input circuit.

As a trigger that starts the training of the input circuit, for example, a method is available in which a command is received from the controller 100 during any operation other than the training of the input circuit. That is, the training circuit 22 can execute training in response to a start command received from the exterior (controller 100).

[1-2] Operations

Now, the training operation for the input circuit according to the present embodiment will be described using FIG. 3 and FIG. 4. The training of the input circuit is executed in parallel with each of the memory core operations, for example, the data read operation, the data write operation, and the data erase operation. For example, the training of the input circuit is executed during the memory core operation for a read process before a first write process using the input circuit. Similarly, the training of the input circuit is executed during the memory core operation for the first write process before a second write process using the input circuit. The training of the input circuit is executed not only for a process of using the input circuit immediately after the training but also for a process of using the input circuit at any point in time after the training. The training during each of the read, write, and erase operations will be described below in order.

[1-2-1] Training During the Read Operation

The controller 100 receives a control signal through the control signal input terminal 19 of the memory 10 and sequentially receives a read command and an address through the data IO terminal 15.

The control signal is input to the control circuit 18 via the control signal input terminal 19. The read command and the address are sequentially input to the control circuit 18 via the data IO terminal 15 and the data IO buffer 14.

Figure 3:
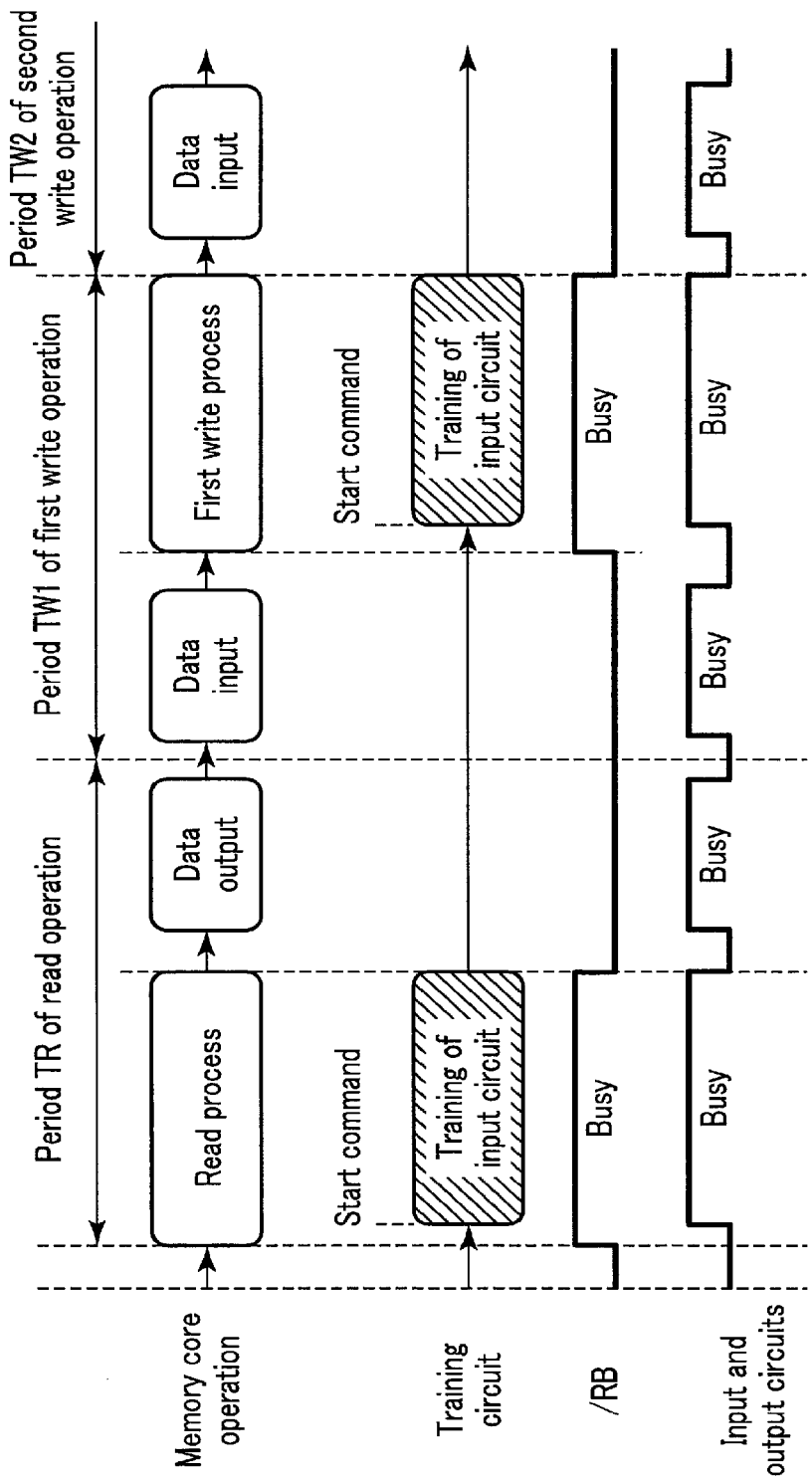
FIG. 3 is a time chart illustrating a training method of an input circuit according to the first embodiment.

In accordance with the control signal and the read command, the control circuit 18 executes the read process as illustrated in FIG. 3. The control circuit 18 controls the memory cell array 11, the bit line control circuit 12, the column decoder 13, the data IO buffer 14, the row decoder 17, and the source line control circuit 20 so as to allow data to be read from the memory cell MC indicated by the address. Furthermore, during the control of the memory core operation by the control circuit 18, the ready/busy circuit 21 outputs a ready/busy signal /RB in a busy state to the controller 100. When the ready/busy signal /RE indicates the busy state, the memory cores such as the memory cell array 11, the bit line control circuit 12, the column decoder 13, the data IO buffer 14, the row decoder 17, and the source line control circuit 20 are in operation, preventing any other core operation instructions from being accepted. Additionally, in FIG. 3 and FIG. 4, when the input and output circuits are in the busy state, the input and output circuits are in operation, precluding any other input or output operations from being performed.

During the read process, data is read from the memory cells MC in the block BLK selected by the row decoder 17, into the data storage circuit in the bit line control circuit 12.

On the other hand, the training circuit 22 executes the training of the input circuit in parallel with the read process. The input circuit means, for example, the bit line control circuit 12, the data IO buffer 14, and the termination circuit 16. The training at this time is executed, for example, for a write process following the read process. The training circuit 22 may be configured to start the training upon receiving the start command from the controller 100 during a period when the ready/busy signal indicates the busy state (during the read process).

Subsequently, when the read process is completed, the ready/busy circuit 21 outputs the ready/busy signal /RB for the ready state to the controller 100.

Furthermore, when the read process is completed, data in the bit line control circuit 12 is output to the controller 100 through the data IO terminal 15 via the data IO buffer 14.

After such data output, the read operation is completed. The period TR of the read operation corresponds to a period of the read process and a period of the data output. The input and output circuits remain in the busy state during the read process and the data output. The input and output circuits mean, for example, the bit line control circuit 12 and the data IO buffer 14.

[1-2-2] Training During the Write Operation

The controller 100 inputs the control signal through the control signal input terminal 19 of the memory 10 and sequentially inputs the write command, the address, and the data through the data IO terminal 15.

The control signal is input to the control circuit 18 via the control signal input terminal 19. The write command and the address are sequentially input to the control circuit 18 via the data IO terminal 15 and the data IO buffer 14. During a period of data input during a period TW1 depicted in FIG. 4, the data is input to the data IO buffer 14 via the data IO terminal 15.

The control circuit 18 executes the first write process in accordance with the control signal and the write command. The control circuit 18 controls the memory cell array 11, the bit line control circuit 12, the column decoder 13, the data IO buffer 14, the row decoder 17, and the source line control circuit 20 so as to allow the data to be written to the memory cell MC indicated by the address. Furthermore, during such control of the memory core operation by the control circuit 18, the ready/busy circuit 21 outputs the ready/busy signal /RB for the busy state to the controller 100.

During the first write process, the data from the data IO buffer 14 is stored in the data storage circuit in the bit line control circuit 12 and written to the memory cells MC in the block BLK selected by the row decoder 17.

On the other hand, the training circuit 22 executes the training of the input circuit in parallel with the first write process. The training at this time is executed, for example, for a write process following the first write process. The training circuit 22 may be configured to start the training upon receiving the start command from the controller 100 during a period when the ready/busy signal indicates the busy state (during the first write process).

Subsequently, when the first write operation is completed, the ready/busy circuit 21 outputs the ready/busy signal /RB for the ready state to the controller 100. The period TW1 of the first write operation corresponds to a period of the data output and the period of a first write process. The input and output circuits remain in the busy state during the data input and the first write process.

Subsequent write processes such as a second write process are executed similarly to the first write process.

[1-2-3] Training During the Erase Operation

The controller 100 inputs the control signal through the control signal input terminal 19 of the memory 10 and sequentially inputs the erase command and the address through the data IO terminal 15.

The control signal is input to the control circuit 18 via the control signal input terminal 19. The erase command and the address are sequentially input to the control circuit 18 via the data IO terminal 15 and the data IO buffer 14.

Figure 4:
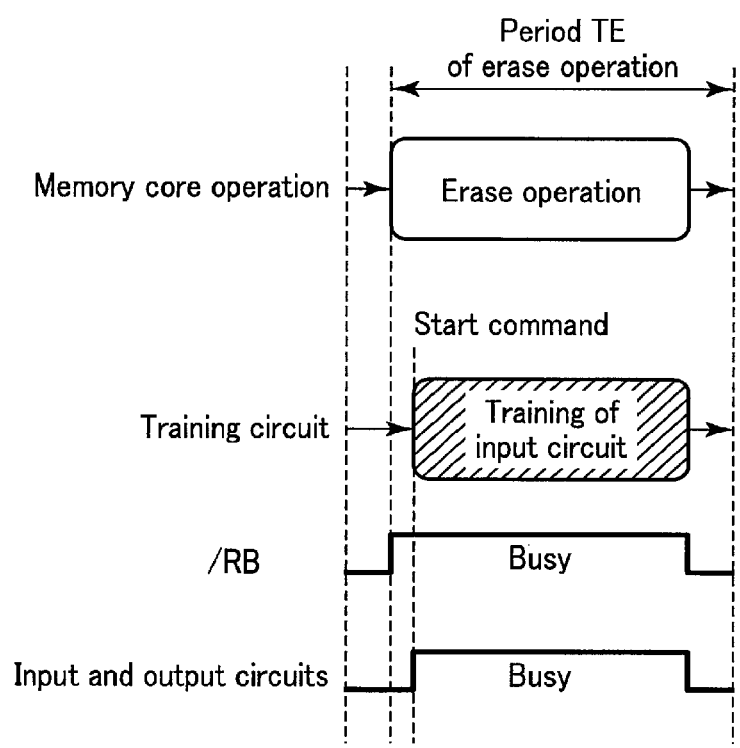
FIG. 4 is a time chart illustrating the training method of the input circuit according to the first embodiment.

The control circuit 18 executes the erase process in accordance with the control signal and the erase command as depicted in FIG. 4. The control circuit 18 controls the memory cell array 11, the bit line control circuit 12, the column decoder 13, the data IO buffer 14, the row decoder 17, and the source line control circuit 20 so as to allow the data in the memory cell MC indicated by the address to be erased. Furthermore, during such control of the memory core operation by the control circuit 18, the ready/busy circuit 21 outputs the ready/busy signal /RB for the busy state to the controller 100.

During the erase process, the data is erased from the memory cells MC in the block BLK selected by the row decoder 17.

On the other hand, the training circuit 22 executes the training of the input circuit in parallel with the erase process. The training at this time is executed, for example, for a write process following the erase process. The training circuit 22 may be configured to start the training upon receiving the start command from the controller 100 during a period when the ready/busy signal indicates the busy state (during the erase process).

Subsequently, when the erase operation is completed, the ready/busy circuit 21 outputs the ready/busy signal /RB for the ready state to the controller 100. The period TE of the erase operation corresponds to a period of the erase process. The input and output circuits remain in the busy state during the training of the input circuit.

[1-3] Effects According to the First Embodiment

The present embodiment is configured to execute the training of the input circuit in parallel with the operation of the memory, enabling a reduction in time needed for all the operations.

In this regard, the operation of the memory may be one of the read, write, and erase operations performed on the memory cell array 11 or the operation of setting the output circuit. Both operations correspond to a case where the operation involves the output of a signal indicating the busy state. In this regard, particularly the NAND flash memory takes a very long time for the operations of the memory cores, included in the memory operations, and thus, the training in parallel with the operation of the memory core is very effective.

In addition, according to the present embodiment, the training circuit 22 executes the training in response to the start command received from the controller 100. Thus, a timing to start the training can be easily controlled by the controller 100.

Figure 6:
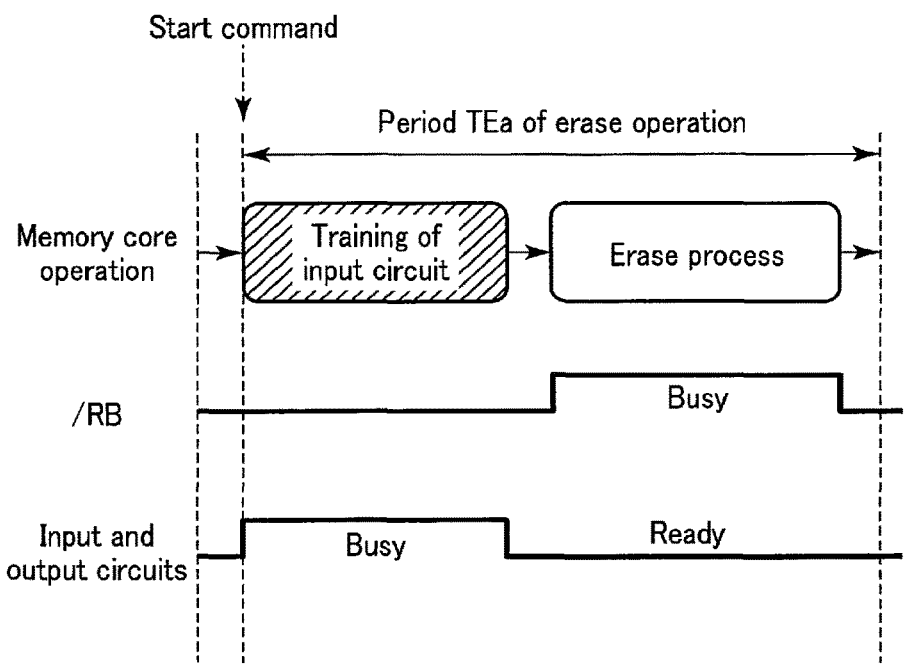
FIG. 6 is a time chart of the comparative example for illustrating the effects according to the first embodiment.

Now, the effects of the present embodiment will be described using a training method illustrated in FIG. 5 and FIG. 6 as a comparative example. The training method in the comparative example involves the serial execution of the read process on the memory core, the data output, and the write process on the memory core so as to avoid overlap between the busy state of the memory core operation and the busy state of the input and output circuits. In general, the training of the input circuit is frequently executed to allow correction of the adverse effects of changes in a peripheral environment on the input circuit, increasing the speed of data transfer.

The training method in such a comparative example normally poses no problem. However, the present inventors' examinations indicate that the training method has room for improvement in terms of the serial execution of the training method with respect to the memory core operation. For example, the training method in the comparative example fails to allow the memory core operation to be performed during the training of the input circuit. Thus, the data transfer rate decreases with increasing time for which the memory core operation is prevented from being performed, leading to an increased time needed for all the operations. Another factor for this is that the training method in the comparative example is started by the command input when the ready/busy signal /RB indicates the ready state.

On the other hand, the present embodiment executes the training of the input circuit in parallel with the operation of the memory core to enable a reduction in the time needed for all the operations. For example, a relation TW1<TW1*a* is present between the period TW1 of the first write operation according to the present embodiment and a period TW1*a* of the first write operation according to the comparative example. That is, the period TW1 of the first write operation according to the present embodiment and the period TW1*a* of the first write operation according to the comparative example have a relation in which the period tW1 is shorter than the period TW1*a* by the amount of time needed for the training. Similarly, a period TE of the erase operation according to the present embodiment and a period TE*a* of the erase operation according to the comparative example have a relation in which the TE is shorter than the period TE*a* by the amount of time needed for the training (TE<TE*a*). Another factor for this relation is that the training method according to the present embodiment is started by the command input when the ready/busy signal/RB indicates the busy state.

[1-4] Variation According to the First Embodiment

[1-4-1] First Variation

Figure 7:
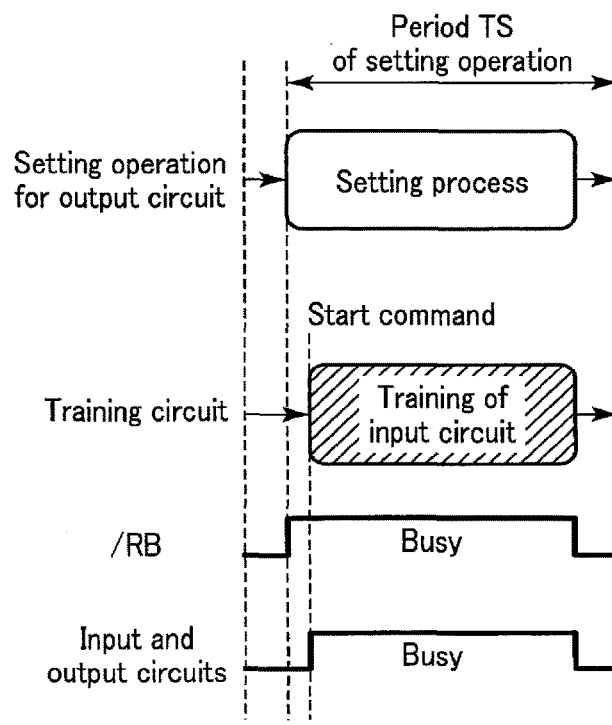
FIG. 7 is a time chart for illustrating a first variation of the training method of the input circuit according to the first embodiment.

A first variation of the semiconductor memory device according to the first embodiment will be described with reference to FIG. 7. This variation is different from the above-described first embodiment in that the control circuit 18 controls the output circuit setting operation of performing impedance setting on the output circuit or the like. Thus, the training circuit 22 executes the training of the input circuit during the control of the output circuit setting operation by the control circuit 18. Also in this case, the training of the input circuit is executed in parallel with the output circuit setting operation to enable a reduction in the time needed for all the operations. For example, the training method according to the comparative example is executed serially with respect to the output circuit setting operation. Thus, a period TS of the setting operation according to the present variation can be made shorter than a period of the setting operation according to the comparative example.

[1-4-2] Second Variation

Figure 10:
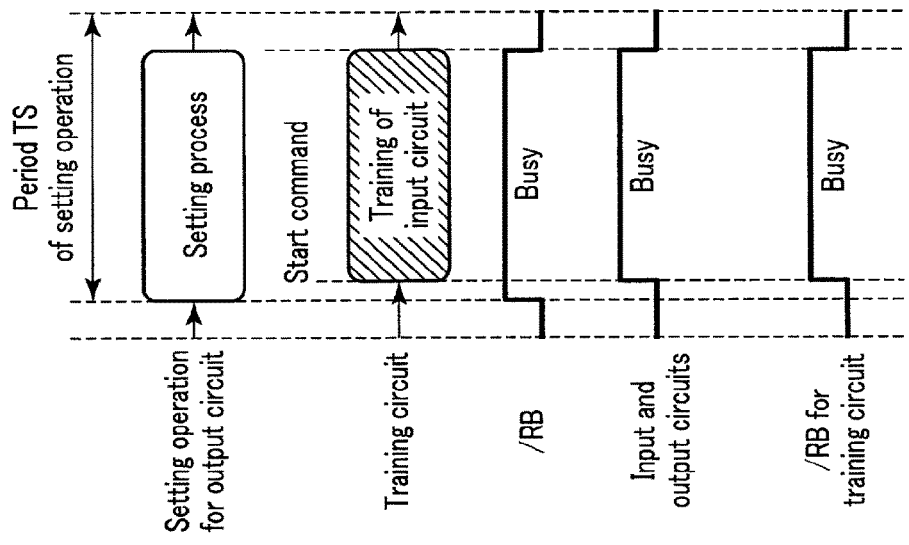
FIG. 10 is a time chart for illustrating the second variation of the training method of the input circuit according to the first embodiment.
Figure 9:
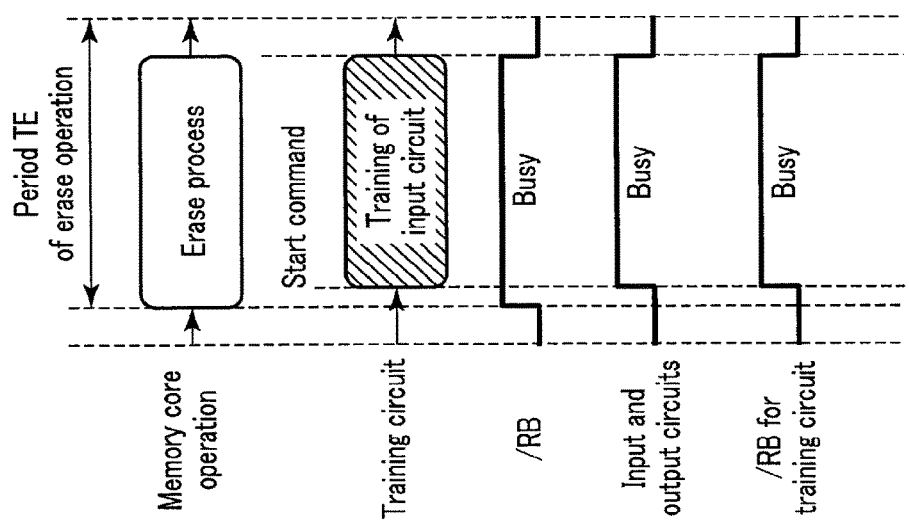
FIG. 9 is a time chart for illustrating the second variation of the training method of the input circuit according to the first embodiment.

A second variation of the semiconductor memory device according to the first embodiment will be described using FIG. 8, FIG. 9, and FIG. 10. This variation is different from the above-described first embodiment in that the ready/busy circuit 22 outputs a ready/busy signal /RB for the training circuit 22 instead of the ready/busy signal /RB for the control circuit 18. Thus, for example, the controller 100 can input the training start command to the memory 10 when the ready/busy signal /RB for the training circuit 22 indicates the ready state.

[1-4-3] Third Variation

A third variation of the semiconductor memory device according to the first embodiment will be described. This variation is different from the first embodiment in that a status indicating that the input circuit is being trained is used and output to the controller 100 during status read. Thus, for example, the controller 100 need not input the training start command to the memory 10 when the status indicates that the training is in execution.

Second Embodiment

[2.1] Configuration

[2-1-1] Configuration of the NAND Flash Memory

Now, a NAND flash memory serving as a semiconductor memory device according to a second embodiment will be described. FIG. 11 is a schematic diagram depicting a partial configuration of the NAND flash memory according to the second embodiment.

The second embodiment is a specific example of the first embodiment, specifically illustrating examples of the bit line control circuit 12, the data IO buffer 14, the data IO terminal 15, and the training circuit 22.

In this regard, the bit line control circuit 12 comprises a deskew circuit 12a for reducing skew in data received from a data input buffer 14a and a latch circuit 12b for writing data output from the deskew circuit 12a to the memory cell MC. In this case, the skew means the magnitude of a temporal difference between a plurality of events to simultaneously take place when a plurality of data transmission processes are executed.

The data IO buffer 14 comprises the data input buffer 14a for inputting data received through the data IO terminal 15 via the termination circuit 16 to the bit line control circuit 12, and a data output buffer.

The data input buffer 14a is a circuit functioning as a comparator that compares a reference voltage Vref with the voltage of data received from the termination circuit 16. In accordance with the result of the comparison, the data input buffer 14a outputs the data to the deskew circuit 12a. In FIG. 11, the deskew circuit 12a, the data input buffer 14a, and the termination circuit 16 form an input circuit 23 to be trained.

The data IO terminal 15 comprises a plurality of input/output pins (also referred to as IO pins) 15a. The IO pins 15a connect the exterior (the controller 100 not depicted in the drawings), the data IO buffer 14, and the termination circuit 16 together.

The termination circuit 16 comprises, for each of the IO pins 15a, a p-type transistor (also referred to as a pMOS transistor, a switch transistor, or the like) 16a, a termination resistor 16b, a termination resistor 16c, and an n-type transistor (also referred to as an nMOS transistor, a switch transistor, or the like) 16d (not depicted in the drawings).

In the p-type transistor 16a, a power supply VCCQ is applied to one end of a current path, and a signal ODTENBn is applied to a gate.

The termination resistor 16b is connected to the other end of the transistor 16a at one end of the termination resistor 16b and to the IO pin 15a at the other end of the termination resistor 16b.

The termination resistor 16c is connected to the IO pin 15a and the other end of the termination resistor 16b at one end of the termination resistor 16c.

One end of the current path in the n-type transistor 16d is connected to the other end of the termination resistor 16c. A ground potential VSSQ is applied to the other end of the current path in the n-type transistor 16d. A signal ODTENB is applied to a gate of the n-type transistor 16d.

The p-type transistor 16a and the n-type transistor 16d may be simply referred to as switch transistors when not distinguished from each other. Furthermore, the signal ODTENBn is an inverted signal of the signal ODTENB. The signal ODTENBn and the signal ODTENB are provided by the control circuit 18.

The circuit comprising the transistors 16a, 16d and the termination resistors 16b, 16c on the memory chip (memory 10) is also referred to as an ODT (On-Die Termination) circuit. Furthermore, a resistor (the transistor 16a and the termination resistor 16b) connecting the IO pin 15a and the power supply VCCQ together may be referred to as a pull-up circuit. A resistor (the transistor 16d and the termination resistor 16c) connecting the IO pin 15a and the ground potential VSSQ together may be referred to as a pull-down circuit.

When the transistor 16a is turned on, an on resistance is generated in the current path in the transistor 16a, and the transistor 16a has a resistance value Ron_p. Furthermore, when the transistor 16d is turned on, an on resistance is also generated in the current path in the transistor 16d, and the transistor 16d has a resistance value Ron_n. Additionally, the termination resistors 16b and 16c have respective changeable (adjustable) resistance values. Specifically, each of the termination resistors 16b, 16c comprises, for example, a plurality of transistors connected together in series or in parallel, and may be configured such that the control circuit 18 changes the number of transistors turned on to allow the resistance value to be set based on the on resistance. Alternatively, each of the termination resistors 16b, 16c comprises a plurality of resistors and a plurality of transistors, and may be configured such that the control circuit 18 changes the number of transistors turned on and the number of resistors connected together in series or in parallel so as to set the resistance value.

In addition, before the data read operation, the data write operation, and the data erase operation are performed, the transistors 16a, 16d in the termination circuit 16 in each of the unselected memories 10 are turned on. In this case, the termination circuit 16 in each of the unselected memories is set to an enabled state to suppress reflection of signals in a data bus. Thus, signal characteristics are improved.

Furthermore, after the data read operation, the data write operation, and the data erase operation are performed, the transistors 16a, 16d in the termination circuit 16 in each of the unselected memories 10 are turned off. In this case, the termination circuit 16 is reset to reduce wasteful current consumption.

On the other hand, the training circuit 22 comprises an ODT adjustment circuit 22a, a Vref adjustment circuit 22b, and a skew adjustment circuit 22c as adjustment circuits that execute the above-described training method.

The ODT adjustment circuit 22a has a function to adjust the termination resistance value of the termination circuit 16.

The Vref adjustment circuit 22b has a function to adjust the reference voltage Vref for the data input buffer 14a.

The skew adjustment circuit 22c has a function to adjust the deskew circuit 12a to regulate skew in data passing through the deskew circuit 12a.

[2-2] Operations

Now, the training operation of the input circuit according to the present embodiment will be described using FIG. 3, FIG. 4, and FIG. 7. The training circuit 22 executes the training of the input circuit 23 in parallel with, for example, the memory core operations such as the data read operation, the data write operation, and the data erase operation, and the output circuit setting operation of setting the impedance of the output circuit.

At this time, the training circuit 22 executes the training using any one of the ODT adjustment circuit 22a, the Vref adjustment circuit 22b, and the skew adjustment circuit 22c for each memory core operation or each output circuit setting operation. For example, the controller 100 inputs the training start command indicating any one of the adjustment circuits 22a to 22c to the memory 10 each time the controller 100 receives the ready/busy signal /RB indicating the busy state from the memory 10. Thus, any one of the adjustment circuits 22a to 22c executes the training in accordance with the start command for each memory core operation and each output circuit setting operation.

The controller 100 can optionally set the order and frequency of start commands indicating any one of the ODT adjustment circuit 22a, the Vref adjustment circuit 22b, and the skew adjustment circuit 22c. For example, controller 100 can optionally set the order and frequency of start commands each indicating any one of the adjustment circuits 22a to 22c. Alternatively, the controller 100 may dynamically change the order and frequency of start commands each indicating any one of the adjustment circuits 22a to 22c in accordance with changes in the environment such as the separately detected temperature of the memory 10.

In any case, the training circuit 22 executes the training of the input circuit in parallel with the memory core operation or the output circuit setting operation in accordance with the start command received from the controller 100. For example, the ODT adjustment circuit 22a adjusts the termination resistance value of the termination circuit 16. The Vref adjustment circuit 22b adjusts the reference voltage Vref for the data input buffer 14a. The skew adjustment circuit 22c adjusts the deskew circuit 12a to regulate the skew in the data passing through the deskew circuit 12a.

[2-3] Effects According to the Second Embodiment

According to the present embodiment, the specific examples of the input circuit 23 and the training circuit 22 allow the effects of the first embodiment to be exerted. That is, the present embodiment allows execution of the training of the input circuit 23 such as the deskew circuit 12a, the data input buffer 14a, or the termination circuit 16 in parallel with the operation of the memory. For example, the deskew circuit 12a can be adjusted in parallel with the operation of the memory, thus enabling a reduction in time needed for all the operations, while allowing the characteristics of the deskew circuit 12a to be optimized. Furthermore, for example, the reference voltage Vref for the data input buffer 14a is adjusted in parallel with the operation of the memory, thus enabling a reduction in time needed for all the operations, while allowing variation in reference voltage Vref to be suppressed with respect to changes in the environment such as the temperature. Additionally, for example, the resistance value of the termination circuit 16 can be adjusted in parallel with the operation of the memory, thus enabling a reduction in the time needed for all the operations, while allowing variation in reference voltage to be suppressed against changes in the environment such as the temperature.

[2-4] Variation of the Second Embodiment

The second embodiment is not limited to the use of any one of the circuits 22a to 22c for each operation of the memory such as the memory core operation or the output circuit setting operation but may be varied such that two or more of the circuits 22a to 22c are run in parallel for each memory core operation or each output circuit setting operation.

The second embodiment may be optionally combined with each of the variations of the first embodiment.

The first and second embodiments are not limited to the above-described forms but many variations may be made to the embodiments. For example, in the above-described embodiments, the case has been described where the memory 10 and the controller 100 are separate semiconductor chips, by way of example. However, the memory 10 and the controller 100 may be formed in one chip.

Furthermore, the timing charts described in the above-described embodiments are only illustrative and are not limited to the illustrated cases. Likewise, the training of the input circuit according to the second embodiment has been described taking, as an example, the case where the training is executed on the termination circuit 16, the data input buffer 14a, and the deskew circuit 12a. However, the present invention is not limited to this and is applicable to any input circuit that can be trained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   an input circuit configured to input data;
   a memory cell array which includes memory cells enabling data to be held and to which the input data is written;
   a control circuit configured to control operation of a memory relating to the data; and
   a training circuit configured to execute training of the input circuit in parallel with the operation of the memory.

2. The device of claim 1, wherein the operation of the memory is one of a read operation, a write operation, and an erase operation performed on the memory cell array.

3. The device of claim 1, further comprising an output circuit for outputting data read from the memory cell array to an exterior,
   wherein the operation of the memory is an operation of setting the output circuit.

4. The device of claim 1, further comprising a busy circuit that outputs a busy signal indicating a busy state of the control circuit,
   wherein the operation of the memory is an operation involving output of the busy signal indicating the busy state, and
   the training circuit executes the training of the input circuit during a period when the busy signal is outputted.

5. The device of claim 1, wherein the input circuit includes a data input buffer configured to input the data based on a reference voltage, and
   the training circuit adjusts the reference voltage.

6. The device of claim 1, wherein the input circuit includes a termination circuit with an adjustable resistance value, and
   the training circuit adjusts the resistance value.

7. The device of claim 1, wherein the input circuit include a deskew circuit configured to deskew the data, and
   the training circuit adjusts the deskew circuit.

8. The device of claim 1, wherein the training circuit executes the training in response to a start command received from the exterior.

9. The device of claim 1, wherein the semiconductor memory device is a flash memory.

10. A memory system comprising a controller and a semiconductor memory device, the semiconductor memory device comprising:
  an input circuit configured to input data;
  a memory cell array which includes memory cells enabling data to be held and to which the input data is written;
  a control circuit configured to control operation of a memory relating to the data, and;
  a training circuit configured to execute training of the input circuit in parallel with the operation of the memory.

11. The system of claim 10, wherein the operation of the memory is one of a read operation, a write operation, and an erase operation performed on the memory cell array.

12. The system of claim 10, further comprising an output circuit for outputting data read from the memory cell array to the controller,
  wherein the operation of the memory is an operation of setting the output circuit.

13. The system of claim 10, further comprising a busy circuit that outputs a busy signal indicating a busy state of the control circuit,
  wherein the operation of the memory is an operation involving output of the busy signal indicating the busy state, and
  the training circuit executes the training of the input circuit during a period when the busy signal is outputted.

14. The system of claim 10, wherein the input circuit includes a data input buffer configured to input the data based on a reference voltage, and
  the training circuit adjusts the reference voltage.

15. The system of claim 10, wherein the input circuit includes a termination circuit with an adjustable resistance value, and
  the training circuit adjusts the resistance value.

16. The system of claim 10, wherein the input circuit include a deskew circuit configured to deskew the data, and
  the training circuit adjusts the deskew circuit.

17. The system of claim 13, wherein the training circuit executes the training in response to a start command received from the controller during the period when the busy signal is outputted.

18. The system of claim 10, wherein the semiconductor memory device is a flash memory.

\* \* \* \* \*